US007161346B2

(12) United States Patent
Fish et al.

(10) Patent No.: US 7,161,346 B2
(45) Date of Patent: Jan. 9, 2007

(54) METHOD OF HOLDING AN ELECTRONIC COMPONENT IN A CONTROLLED ORIENTATION DURING PARAMETRIC TESTING

(75) Inventors: Jeff Fish, Portland, OR (US); Gerald F. Boe, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 46 days.

(21) Appl. No.: 11/135,728

(22) Filed: May 23, 2005

(65) Prior Publication Data

US 2006/0261832 A1    Nov. 23, 2006

(51) Int. Cl.
 *G01R 31/02*  (2006.01)
 *B65G 29/00*  (2006.01)
 *B07C 5/344*  (2006.01)

(52) U.S. Cl. .................. 324/158.1; 324/754; 324/765; 198/392; 209/573

(58) Field of Classification Search ...................... None
See application file for complete search history.

(56) References Cited

U.S. PATENT DOCUMENTS

| | | | |
|---|---|---|---|
| 5,540,317 A | 7/1996 | Braden et al. | 198/393 |
| 5,785,484 A | 7/1998 | Garcia | 414/417 |
| 5,863,331 A | 1/1999 | Braden et al. | 118/261 |
| 5,984,079 A * | 11/1999 | Garcia | 198/397.02 |
| 6,100,707 A * | 8/2000 | Baumann et al. | 324/761 |
| 6,204,464 B1 | 3/2001 | Garcia et al. | 209/574 |
| 6,227,345 B1 * | 5/2001 | Miyamoto | 198/392 |
| 6,294,747 B1 | 9/2001 | Liu et al. | 209/574 |

* cited by examiner

*Primary Examiner*—Minh N. Tang
(74) *Attorney, Agent, or Firm*—Stoel Rives LLP

(57) ABSTRACT

A component handler includes an improved test seat having a shape that ensures that an electronic component seated in the test seat is in an appropriate orientation for parametric testing. The test seat has a base surface and first and second opposed seat side surfaces separated by generally increasing distances from a narrower notch end to a wider notch end. There is an opening at the narrower notch end. An electronic component is seated within this test seat such that the first and second side surfaces of the electronic component rest against the first and second seat side surfaces. A side surface side margin on which is formed a wraparound electrode is exposed by an opening at the narrower notch end and a second side surface side margin on which is formed a second wraparound electrode is exposed by an opening at the wider notch end.

19 Claims, 8 Drawing Sheets

METHOD OF HOLDING AN ELECTRONIC COMPONENT IN A CONTROLLED ORIENTATION DURING PARAMETRIC TESTING

TECHNICAL FIELD

This invention relates to an apparatus for and a method of seating an electronic component in an electronic component holder test seat that holds the electronic component in an orientation that exposes a side margin of the electronic component to enable parametric testing of the electronic component.

BACKGROUND OF THE INVENTION

Electronic component handlers receive numerous electronic components made for use in electronic circuits, present the electronic components to a test probe for parametric testing, and sort the electronic components according to the results of the parametric testing. One exemplary miniature electronic component suitable for handling and testing by an electronic component handler is a low inductance ceramic capacitor (LICC), which is a tiny rectangular "chip" that is smaller than a grain of rice. Additional exemplary electronic components suitable for handling and testing in an electronic component handler include integrated passive components (IPCs), capacitors chips, array chips, and resistors.

FIGS. 1 and 2 show an exemplary LICC or chip 10 that includes a body defined by a pair of first opposite side surfaces 12 (left and right surfaces), a pair of second opposite side surfaces 14 (upper and lower surfaces), and a pair of end surfaces 16 (front and back surfaces). The linear region that forms an edge of any of the surfaces (e.g., first opposite side, second opposite side, or end surfaces) is referred to as a "side margin." Each of the first opposite side surfaces 12 has opposite side margins 18 shared in common with the side margins 20 of different ones of second opposite side surfaces 14. First opposite side surfaces 12 are spaced apart by a first distance (d1) defined by first opposite side margins 22 of end surfaces 16. Second opposite side surfaces 14 are spaced apart by a second distance (d2) defined by second opposite side margins 24 of end surfaces 16. Chip 10 also includes corner regions where three edges of any of the surfaces (e.g., first opposite side, second opposite side, or end surfaces) meet and form an angle. As is known to those of skill in the art, chip 10 may contain within its body multiple spaced-apart metal plates or may be a solid substrate. Chip 10 typically has a square or rectangular cross section.

Chip 10 further includes a first wraparound electrode 30 that wraps around each opposite side margin 18 in one of the pair of first opposite side surfaces 12. First wraparound electrode 30 forms first electrical contact regions 32 on second opposite side surfaces 14. Chip 10 further includes a second wraparound electrode 34 that wraps around each opposite side margin 18 of the other one of the pair of first opposite side surfaces 12. Second wraparound electrode 34 forms second electrical contact regions 36 on second opposite side surfaces 14.

First and second wraparound electrodes 30 and 34 are formed by application of an electrically conductive paste to chip 10. Great precision is needed when forming wraparound electrodes 30 and 34 to ensure that none of the conductive paste connects first and second electrical contact regions 32 and 36. Connection of opposed first and second wraparound electrodes 30 and 34 would form an electrically conductive bridge whose existence would cause the resulting chip 10 to become a short circuit. Consequently, first and second electrical contact regions 32 and 36 occupy only a minimal portion (e.g., about 15%) of each of second opposite side surfaces 14. There is no electrically conductive paste on either of opposite end surfaces 16.

Methods and apparatuses for testing and sorting large quantities of miniature electronic components, such as the LICC shown in FIGS. 1 and 2, are known in the art. One exemplary prior art method of and apparatus for testing and sorting electronic components is described in U.S. Pat. No. 6,204,464 ("the '464 patent"), which is owned by the assignee of the present patent application. FIGS. 3–7 show the overall arrangement of the physical elements of the prior art electronic component handler described in the '464 patent.

As shown in FIGS. 3 and 4, a high-speed electronic component handler 50 includes a rotatable feed wheel 52 that is mounted on a central shaft 54 and that rotates in a counterclockwise direction. Feed wheel 52 includes an outer rim 56 that is concentric with the axis (not shown) of central shaft 54. Feed wheel 52 is positioned at an angle, preferably 45°, to the horizontal and includes an upper surface 58 capable of receiving multiple, randomly oriented electronic components.

Feed wheel 52 includes multiple radially extending, spaced-apart bosses 66 that are uniformly angularly spaced along outer rim 56. Each boss 66 has a length sufficient to hold two or more chips 10 in a line and a width that is sufficiently narrow to admit each chip 10 only in an edgewise orientation such that each chip 10 rests on one of its first or second opposite side surfaces 12 or 14 as it moves along the length of boss 66. In some embodiments, feed wheel 52 is subject to vibration that causes chips 10 that are placed on feed wheel 52 to enter boss 66.

FIG. 5 shows that as the length of boss 66 approaches outer rim 56, boss 66 turns downward about a chamfered or beveled corner 67 and terminates in an electronic component-sized cavity 68 that has no wall facing outward from outer rim 56. Each component-sized cavity 68 is configured to receive and hold within it a single chip 10 in a controlled orientation such that one of first or second opposite side surfaces 12 or 14 of chip 10 is exposed. Which one of first or second opposite side surfaces 12 or 14 is exposed depends solely on chance, as neither boss 66 nor electronic component-sized cavity 68 preferences which opposite side surface of chip 10 is exposed. A pressure differential created by a vacuum means 70, which is connected to a vacuum chamber 72, holds chip 10 in component-sized cavity 68 during rotation of feed wheel 52.

As shown in FIGS. 3, 6, and 7, a rotating carrier wheel 74 is mounted planar to, and spaced apart from, feed wheel 52 and is rotatable in a clockwise direction. Carrier wheel 74 is arranged in tangential adjacency with outer rim 56 of feed wheel 52 and includes an upwardly extending annular peripheral wall 76 that projects generally perpendicularly from a carrier plate 77. Peripheral wall 76 includes multiple spaced-apart test seats 78 that are uniformly angularly spaced around the periphery of carrier wheel 74. The rotation of carrier wheel 74 is coordinated with the rotation of feed wheel 52 to permit the transfer of chips 10 from feed wheel 52 to carrier wheel 74. More specifically, carrier wheel 74 and feed wheel 52 are rotated in synchronous peripheral velocity such that each test seat 78 is aligned with a component-sized cavity 68 when peripheral wall 76 of carrier wheel 74 and outer rim 56 of feed wheel 52 are in tangential adjacency. In this way, chips 10 in component-sized cavities 68 are transferred to test seats 78. As shown in FIG. 6, a pressure differential created by a second vacuum means 82 draws chips 10 out of component-sized cavities 68 into test seats 78, and a pressure differential created by a third vacuum means 84 holds chips 10 in test seats 78.

As shown in FIG. 7, each test seat 78 has a generally rectangular shape that includes a bottom surface 88 from which upwardly extends two side walls 90. When chip 10 is seated in test seat 78, one of the pair of end surfaces 16 of chip 10 rests upon and is supported by bottom surface 88. Either first opposite side surfaces 12 or second opposite side surfaces 14 are adjacent and generally parallel to side walls 90. Because test seat 78 does not include an outer wall, the other of first or second opposite side surfaces 12 or 14 is exposed.

FIGS. 8A and 8B are top views of chip 10 seated in test seat 78. FIG. 8A shows chip 10 seated in test seat 78 such that first opposite side surfaces 12 are exposed. When first opposite side surfaces 12 are exposed, first and second wraparound electrodes 30 and 34 are exposed, and parametric testing by a test probe 92 can be conducted on first and second wraparound electrodes 30 and 34. Exemplary parametric tests are described in U.S. Pat. No. 5,673,799 and include, but are not limited to, electrical, image, inspection, and visual testing. Testing is typically effected by electrically contacting one or both wraparound electrodes 30 and 34 of chip 10. Following testing, chips 10 are typically ejected from test seats 78 and sorted according to their test results.

FIG. 8B shows chip 10 seated in test seat 78 such that second opposite side surfaces 14 are exposed for contact by test probe 92. As such, first and second wraparound electrodes 30 and 34 are not exposed. Because parametric testing can only be conducted on wraparound electrodes 30 and 34, chip 10 of FIG. 8B cannot be parametrically tested. There is a 50% chance that chip 10 will be seated in test seat 78 with the orientation shown in FIG. 8B. Consequently, the prior art component handler shown in FIGS. 3–7 tests only half of the chips introduced into the handler. These prior art component handlers have significant system inefficiency that results in high manufacturing costs.

What is needed is an apparatus for and a method of seating an electronic component in an electronic component holder test seat such that it holds the electronic component in an orientation that exposes the electrodes of the electronic component to parametric testing.

SUMMARY

An object of the present invention is, therefore, to provide an apparatus for and a method of seating an electronic component in a test seat such that the electronic component is always seated and held in an orientation that exposes the electrodes of the electrical component to parametric testing.

The component handler of the present invention includes a test seat that has a base surface from which extends a side member having first and second opposed seat side surfaces. The first and second seat side surfaces are separated by generally increasing distances from a narrower notch end to a wider notch end, to form a generally v-shaped notch. Also, the first and second seat side surfaces are spaced apart to form an opening at the narrower notch end. An electronic component is seated within this generally v-shaped test seat such that one of the electronic component end surfaces contacts the base surface and one of each of the first and second electronic component side surfaces rests against different ones of the first and second seat side surfaces. Seating the electronic component in this test seat ensures that (1) one of the electrodes on the electronic component projects outwardly through the opening at the narrower notch end and (2) the other electrode is exposed by the wider notch end. Consequently, both electrodes are available for parametric testing, and the percentage of electronic components that can be parametrically tested by the component handler of the present invention is significantly greater than that of prior art component handlers. Further, the electronic component handler of the present invention is capable of testing a greater quantity of electronic components per unit of time than prior art electronic component handlers, thereby reducing manufacturing costs.

Additional aspects and advantages will be apparent from the following detailed description of preferred embodiments, which proceeds with reference to the accompanying drawings.

DETAILED DESCRIPTION OF PREFERRED EMBODIMENTS

The following detailed description of preferred embodiments of an electronic component handler and a method of seating electronic components for parametric testing is made with reference to an LICC. As is known to those of skill in the art, other electronic components may be handled and tested using the electronic component handler of the present invention. Additional exemplary electronic components suitable for handling and testing in preferred embodiments of an electronic component handler include IPCs, capacitors chips, array chips, and resistors. As used herein, the term "component" refers to capacitors, IPCs, array chips, resistors, and any other electronic or electrical device having a form that allows it to be handled by this invention.

Figure 1:
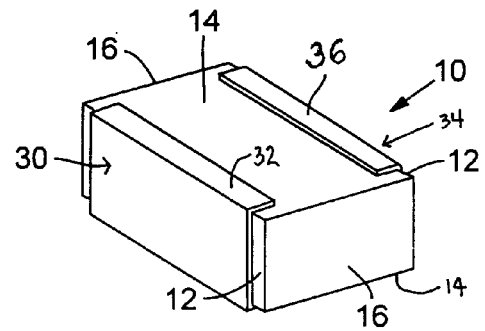
FIG. 1 is an isometric view of an exemplary prior art LICC.
Figure 2:
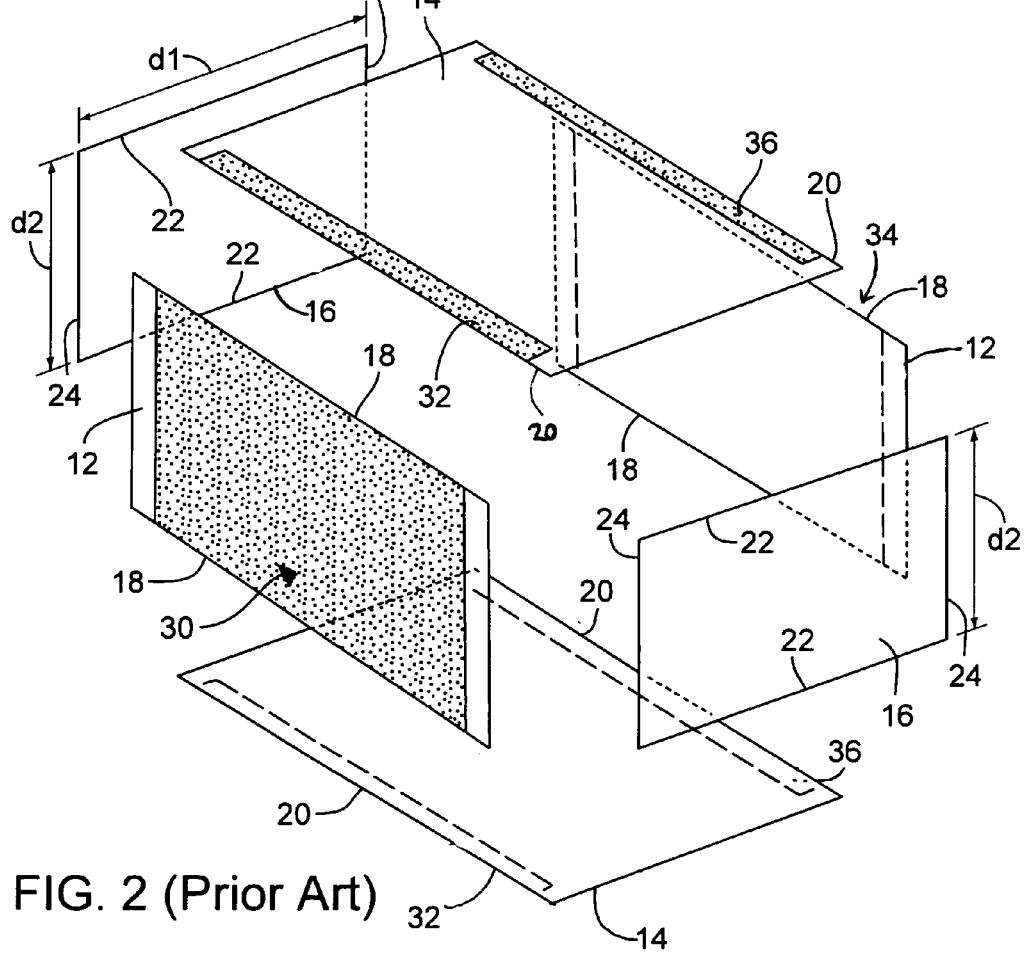
FIG. 2 is an exploded view of the LICC of FIG. 1.
Figure 3:
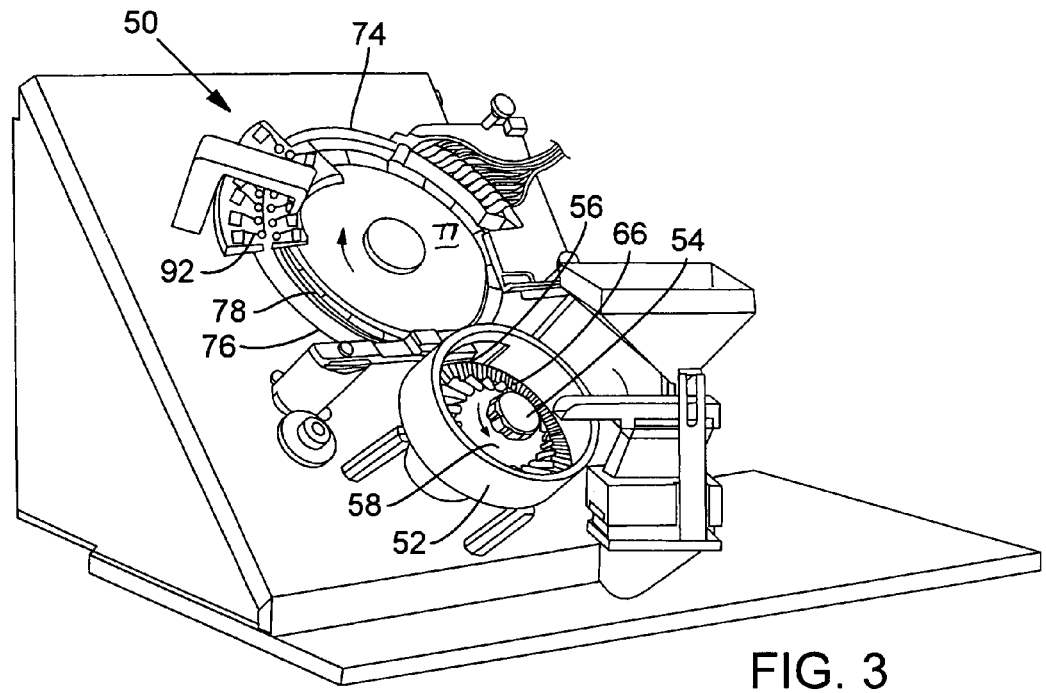
FIG. 3 is a perspective view of a prior art electronic component handler.
Figure 5:
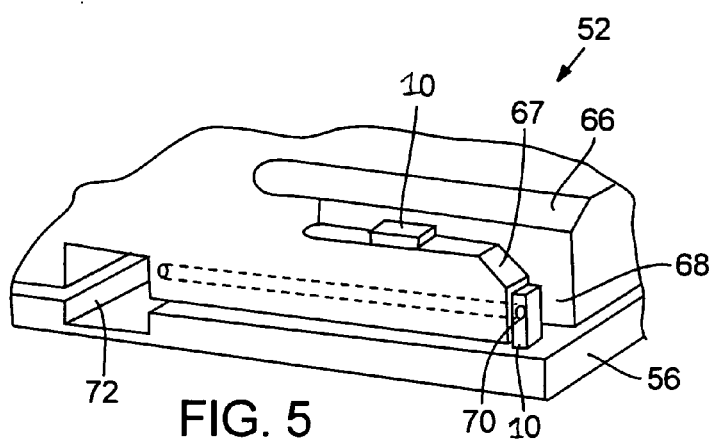
FIG. 5 is an enlarged view of an electronic component traveling along a boss in the feed wheel of FIG. 4.
Figure 4:
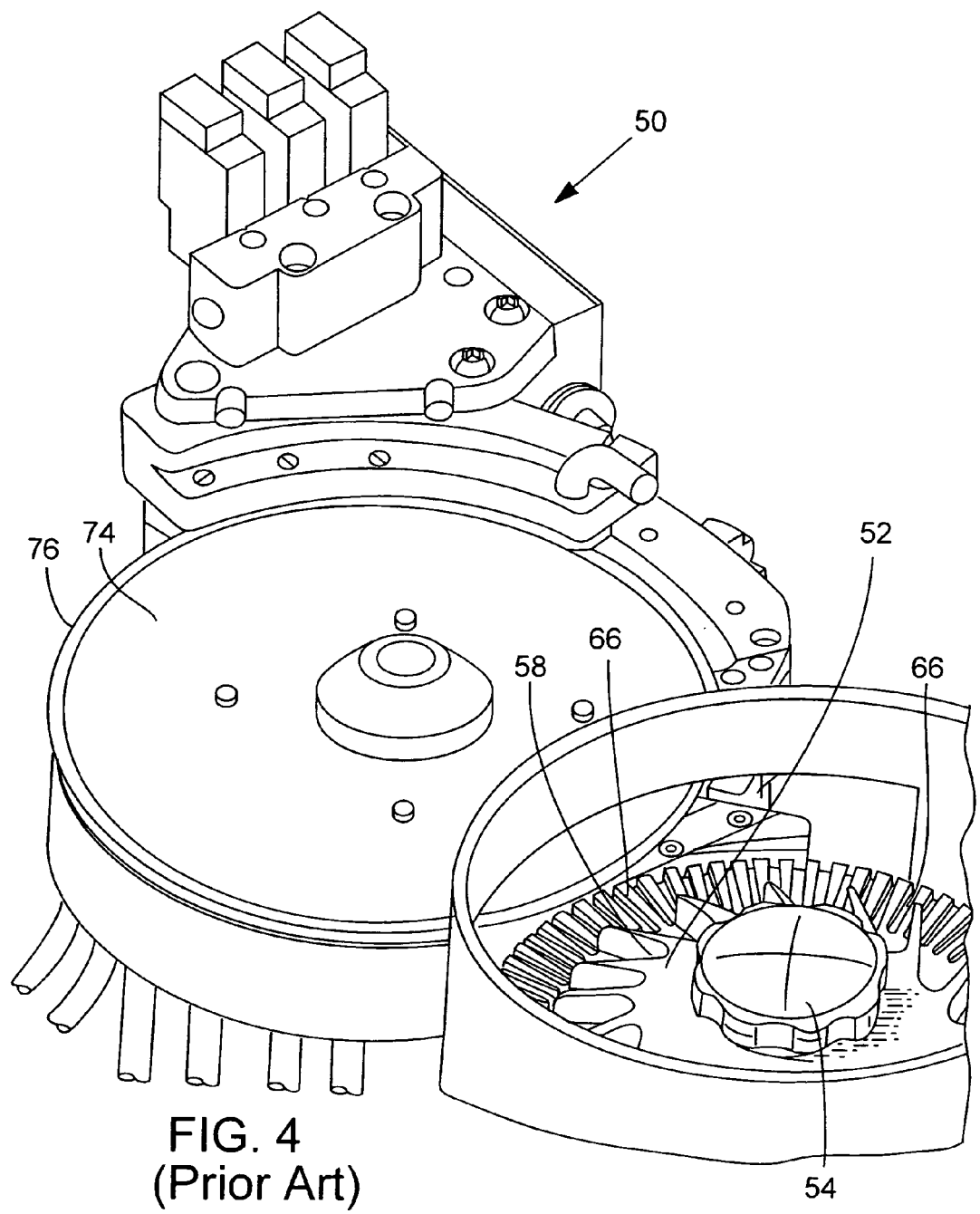
FIG. 4 is a perspective view of the transfer area between the feed wheel and the carrier wheel of the prior art component handler of FIG. 3.
Figure 6:
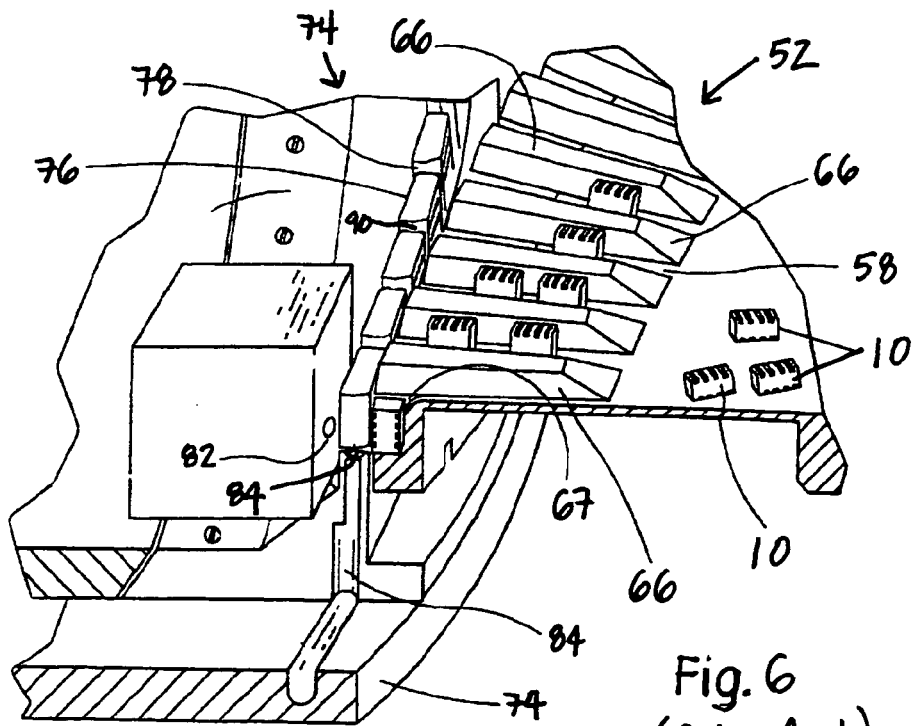
FIG. 6 is an enlarged, partial cross-sectional view of the transfer area between the feed wheel and the carrier wheel shown in FIG. 4.
Figure 7:
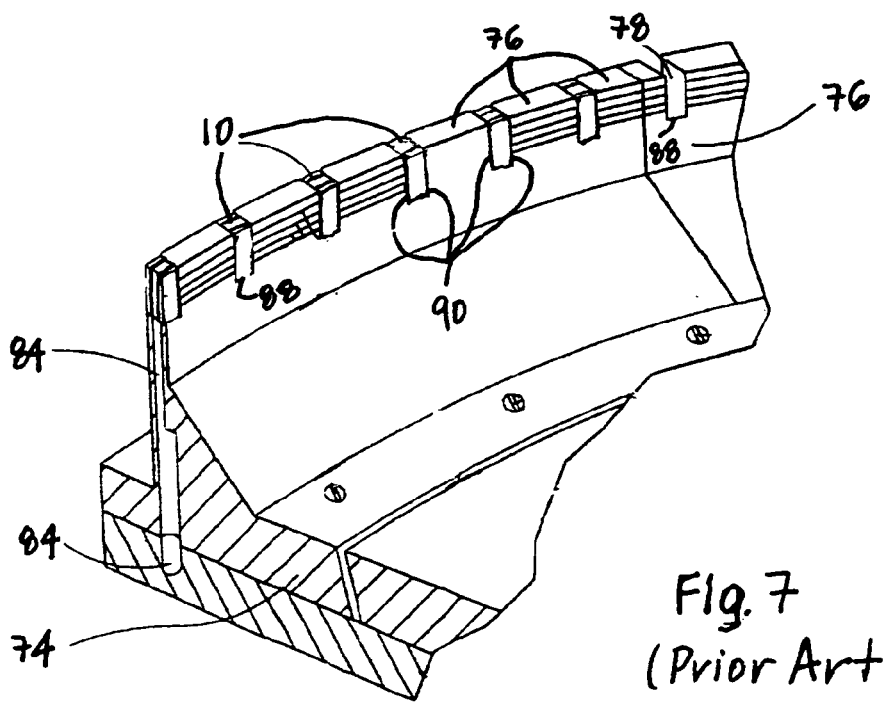
FIG. 7 is an enlarged, partial cross-sectional view of the peripheral wall of the carrier wheel shown in FIG. 4.
Figure 8A:
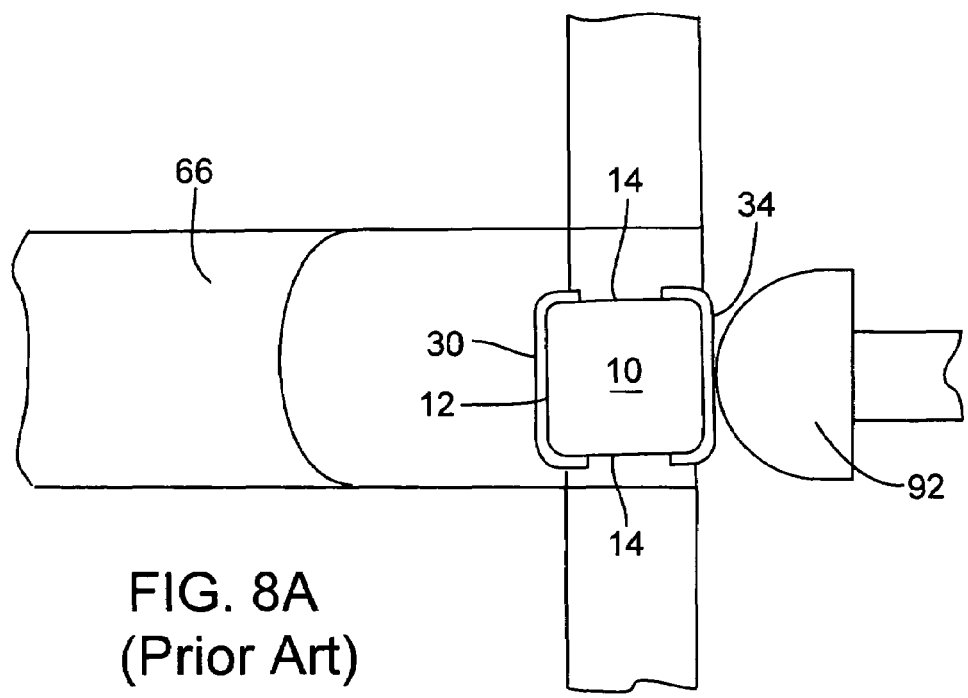
FIGS. 8A and 8B are top views of two different electronic components seated in differing orientations in the prior art test seats shown in FIG. 7.
Figure 8B:
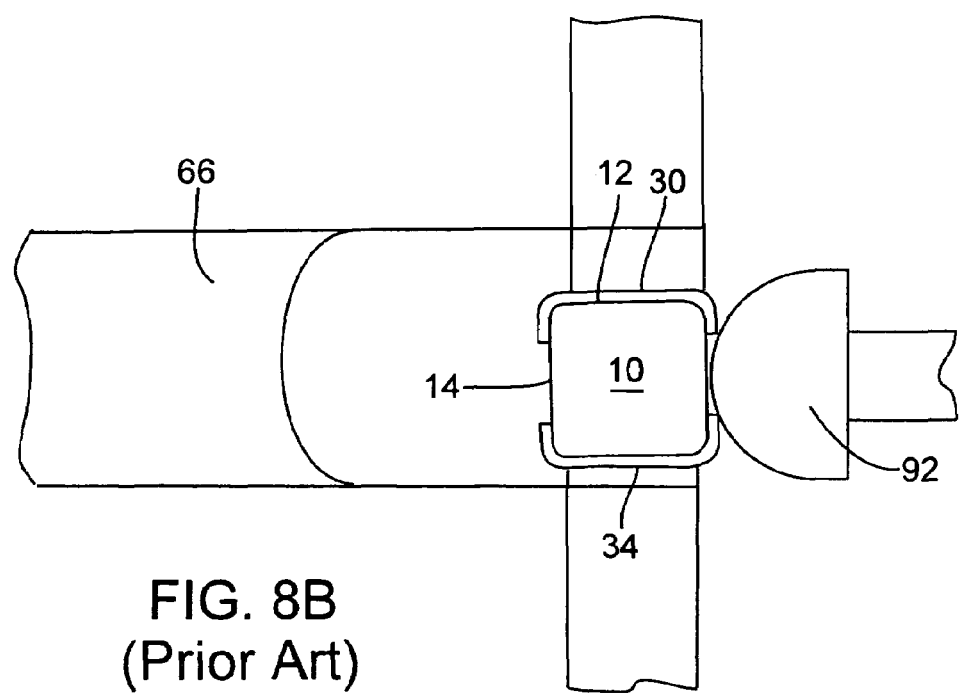

Preferred embodiments of a test seat orient an electronic component such that at least one of its side surface side margins, which is covered by a wraparound electrode, is exposed to contact by a test probe that conducts parametric testing. Because all of the side surface side margins of each electronic component have a wraparound electrode formed on them, any of the side surface side margins can be parametrically tested. Thus all of the electronic components introduced into an electronic component handler including an embodiment of the test seat of the present invention may be parametrically tested. In contrast, and as shown in FIGS. 8A and 8B, prior art test seats exposed a side surface of each electronic component for testing. Because only two of the four side surfaces had electrodes formed on them, only 50% of the electronic components seated in a test seat could be parametrically tested. Consequently, the test seat of the present invention greatly increases the number of electronic components that can be parametrically tested. Thus the efficiency of the electronic component handler is greatly increased, resulting in significantly decreased manufacturing costs.

Figure 9A:
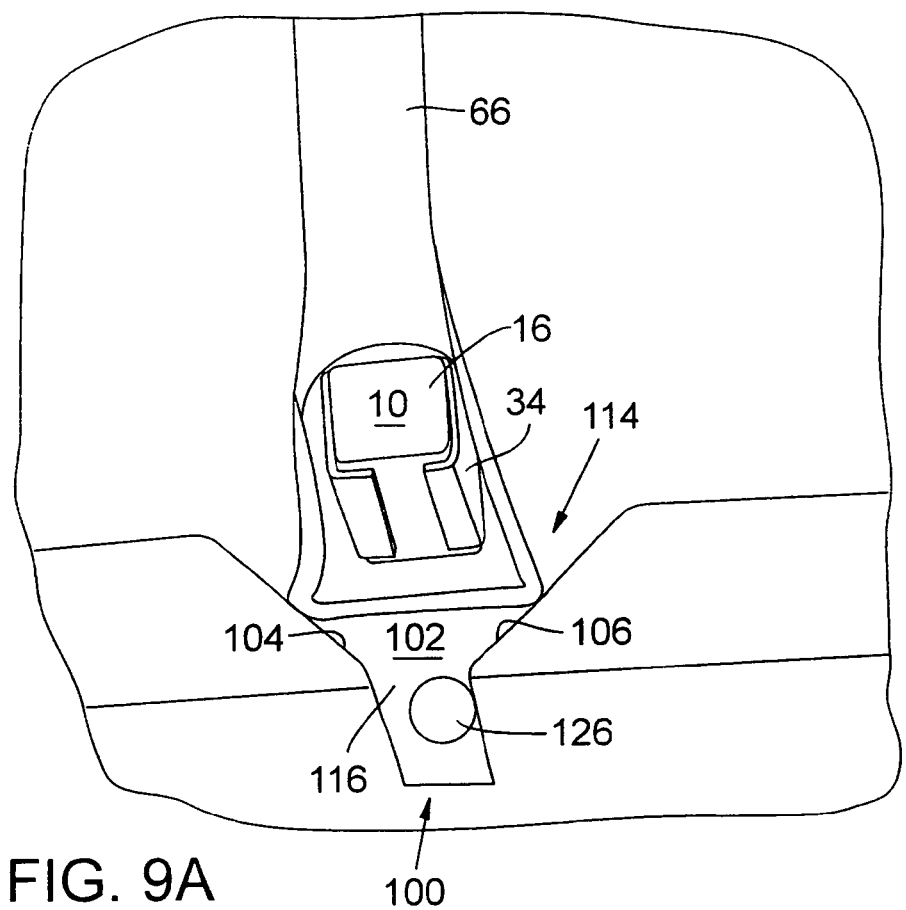
FIG. 9A is an isometric view taken from a top, right perspective showing an electronic component exiting a boss and approaching a v-shaped test seat.
Figure 9B:
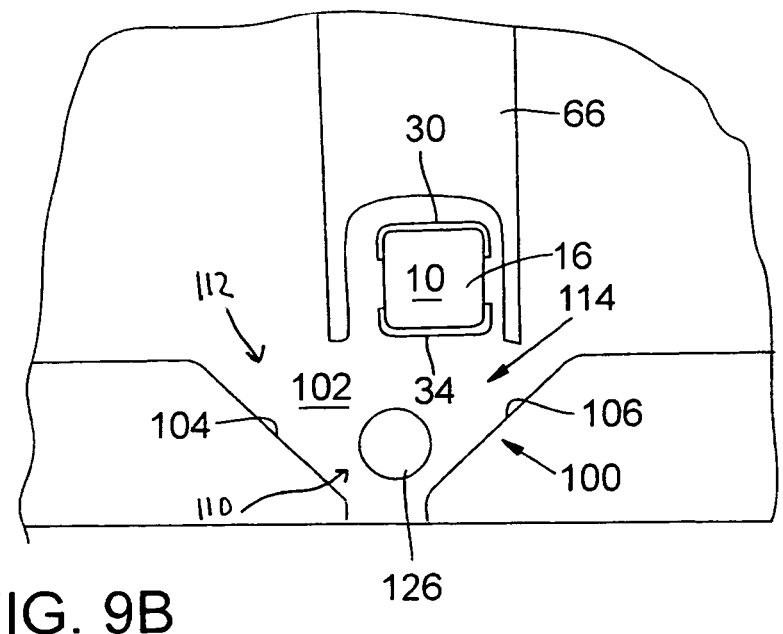
FIG. 9B is a top view of FIG. 9A.

As shown in FIGS. 9A and 9B, a preferred embodiment of a test seat 100 includes a base surface 102 and first and second upwardly extending, opposed seat side surfaces 104 and 106. First and second seat side surfaces 104 and 106 are separated by generally increasing distances from a narrower notch end 110 to a wider notch end 112 to form a notch 114. First and second seat side surfaces 104 and 106 are spaced apart to form an opening 116 at narrower notch end 110. Opening 116 has sufficient width to permit a side surface side margin of electronic component 10 to project through opening 116 without allowing electronic component 10 to drop through opening 116. In one exemplary preferred embodiment, opening 116 replaces what would otherwise form an apex of notch 114, and first and second seat side surfaces 104 and 106 of notch 114 (when extended to form an apex) form an approximate right angle.

Seating of electronic component 10 in test seat 100 may be effected as is commonly known to those of skill in the art, including, for example, by use of a suction, vacuum, or air-blowing process. The term "propulsion" is meant to embrace all of these processes. FIGS. 9A and 9B show a vacuum-creating device 126 that creates a pressure differential that causes electronic component 10 to move into test seat 100.

Figure 10A:
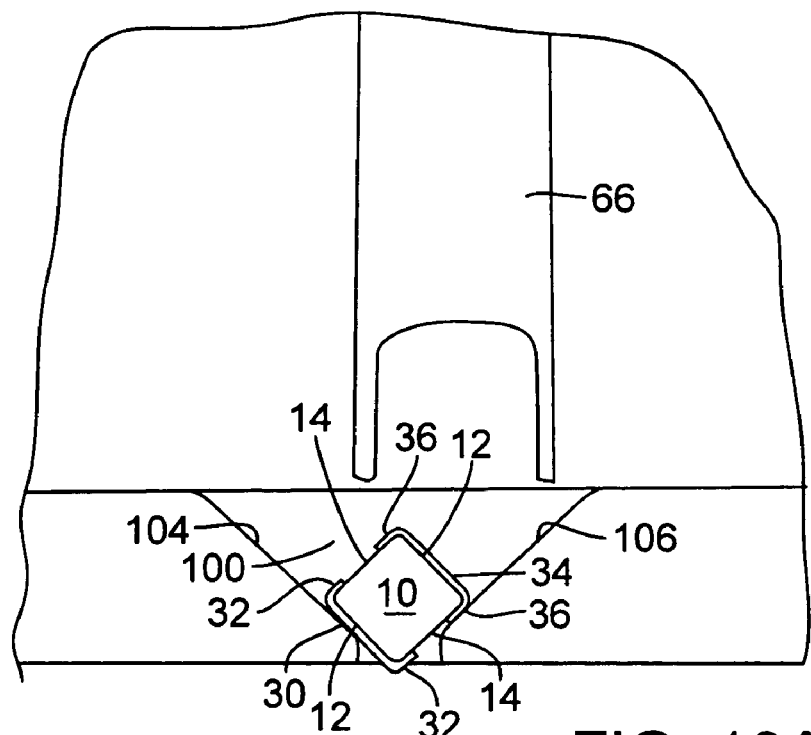
FIGS. 10A and 10B are top views of two different electronic components seated in differing orientations in the v-shaped test seats shown in FIGS. 9A and 9B.

Electronic component 10 of FIG. 10A is seated in test seat 100 such that one of the electronic component end surfaces 16 of chip 10 contacts base surface 102 of test seat 100. Further, first side surface 12 of electronic component 10 rests against first seat side surface 104, and second side surface 14 rests against second seat side surface 106. First wraparound electrode 30 is exposed by and projects slightly outwardly of opening 116 at narrower notch end 110, and second wraparound electrode 34 is exposed by wider notch end 112. Thus both first and second wraparound electrodes 30 and 34 are available for parametric testing.

Figure 10B:
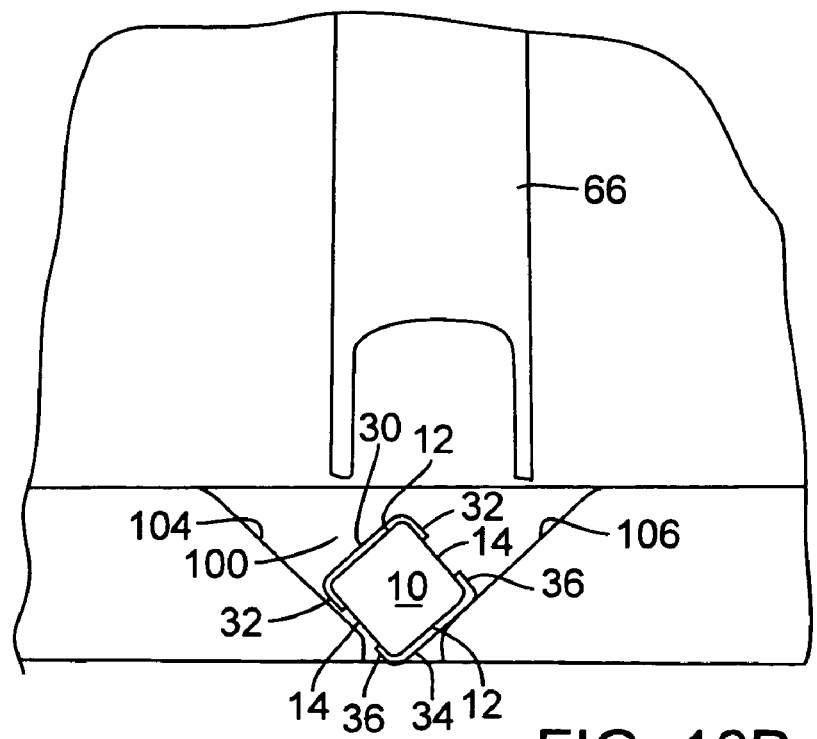

Electronic component 10 of FIG. 10B is seated in test seat 100 such that one of end surfaces 16 of electronic component 10 contacts base surface 102 of test seat 100. Further, second side surface 14 of electronic component 10 rests against first seat side surface 104 of test seat 100, and first side surface 12 of electronic component 100 rests against second seat side surface 106 of test seat 100. Second wraparound electrode 34 is exposed by and projects slightly outwardly of opening 116 at narrower notch end 110, and first wraparound electrode 30 is exposed by wider notch end 112. Thus both first and second wraparound electrodes 30 and 34 are available for parametric testing.

Figure 11:
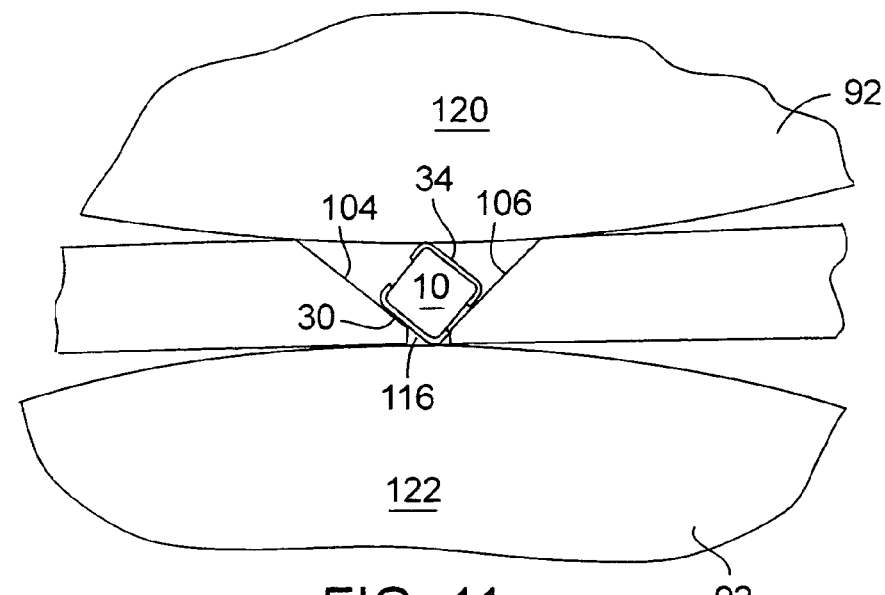
FIG. 11 is a top view of an electronic component seated in a v-shaped test seat while being simultaneously parametrically tested by an upper contact and a lower contact.
Figure 12:
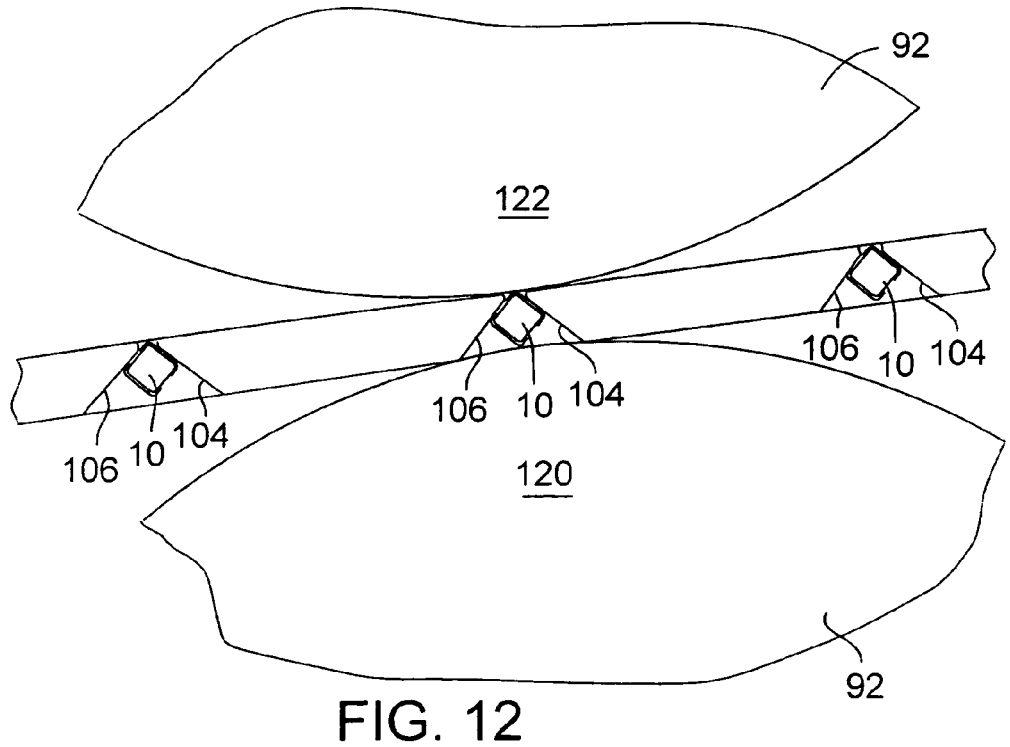
FIG. 12 is a top view of a carrier belt peripheral wall including multiple, spaced-apart v-shaped test seats in each of which is seated an electronic component that is being simultaneously contacted by an upper contact and a lower contact.

FIG. 11 shows electronic component 10 of FIG. 10B seated in test seat 100. Each of first and second wraparound electrodes 30 and 34 are simultaneously parametrically tested by test probes 92, which are shown, by way of example, as upper and lower contacts 120 and 122. Alternatively, only one of first and second wraparound electrodes 30 and 34 may be tested. FIG. 12 shows multiple test seats 100 formed in peripheral wall 76 of carrier wheel 74.

It will be obvious to those having skill in the art that many changes may be made to the details of the above-described embodiments without departing from the underlying principles of the invention. The scope of the present invention should, therefore, be determined only by the following claims.

The invention claimed is:

1. A method of seating an electronic component in a test seat of an electronic component handler such that the electronic component is seated and held in an orientation that exposes a side margin of the electronic component to parametric testing, comprising:

providing an electronic component including a body having a pair of first opposite side surfaces, a pair of second opposite side surfaces, and a pair of end surfaces, each of the pair of first opposite side surfaces having opposite side margins shared in common with side margins of different ones of the second opposite side surfaces, the pair of first opposite side surfaces being spaced apart by a first distance defined by first opposite side margins of the pair of end surfaces and the pair of second opposite side surfaces being spaced apart by a second distance defined by second opposite side margins of the first pair of end surfaces, the electronic component further including a first wraparound electrode wrapping around the opposite side margins of one of the pair of the first opposite side surfaces to form first electrical contact regions on the second side surfaces, and including a second wraparound electrode wrapping around the opposite side margins of the other one of the pair of first opposite side surfaces to form second electrical contact regions on the second side surfaces;

providing a test seat including a base surface from which extends a side member having first and second opposed seat side surfaces, the first and second seat side surfaces separated by generally increasing distances from a narrower notch end to a wider notch end to form a notch, and the first and second seat side surfaces spaced apart to form an opening at the narrower notch end; and seating the electronic component in the test seat such that one of the electronic component end surfaces contacts the base surface and one of each of the first and second electronic component side surfaces rests against different ones of the first and second seat side surfaces so that one of the side margins covered by one of the first and second wraparound electrodes projects outwardly through the opening and one of the side margins covered by the other one of the first and second wraparound electrodes not in proximity to the first and second seat side surfaces is exposed by the wider notch end.

2. The method of claim 1, further comprising:
performing a parametric test on the side margin of the electronic component that extends outwardly of the opening in the narrower notch end of the test seat.

3. The method of claim 1, in which the seating of the electronic component in the test seat is effected by one of a suction or air blowing process.

4. The method of claim 1, in which the first and second opposed seat side surfaces of the test seat are angularly disposed at an approximate right angle.

5. The method of claim 2, in which the parametric test is selected from a group consisting essentially of electrical, image, inspection, and visual testing.

6. The method of claim 1, in which the electronic component is one of a chip capacitor and an integrated passive component.

7. The method of claim 2, in which the parametric test is performed on each of the side margins of the electronic component that project outwardly of the narrower and wider notch ends of the test seat.

8. An electronic component handler capable of receiving multiple, randomly oriented electronic components, seating the electronic components in test seats such that the seated electronic components have a controlled orientation, and performing parametric testing of the electronic components, comprising:

each of the electronic components including a body having a pair of first opposite side surfaces, a pair of second opposite side surfaces, and a pair of end surfaces, each of the pair of first opposite side surfaces having opposite side margins shared in common with side margins of different ones of the second opposite side surfaces, the pair of first opposite side surfaces being spaced apart by a first distance defined by first opposite side margins of the pair of end surfaces and the pair of second opposite side surfaces being spaced apart by a second distance defined by second opposite side margins of the pair of end surfaces;

a first wraparound electrode wrapping around the opposite side margins of one of the pair of the first opposite side surfaces to form first electrical contact regions on the second side surfaces, and a second wraparound electrode wrapping around the opposite side margins of the other one of the pair of first opposite side surfaces to form second electrical contact regions on the second side surfaces;

a feed wheel rotatable in a first direction, mounted on a central shaft, and including an outer rim that is concentric with the central shaft, the feed wheel including an upper surface on which the electronic components are received and multiple radially-extending, spaced-apart bosses that terminate at electronic component-sized cavities formed adjacent to the outer rim of the feed wheel, each component-sized cavity configured to receive and hold within it a single electronic component having a controlled orientation;

a carrier wheel rotatable in a second direction and positioned planar to, and spaced-apart from, the feed wheel, the carrier wheel including a carrier plate from which upwardly extends an annular peripheral wall that is arranged in tangential adjacency and that rotates in synchronous peripheral velocity with the outer rim of the feed wheel;

the peripheral wall including multiple, spaced-apart test seats, each of which is capable of alignment with one of the electronic component-sized cavities in the feed wheel and each of which includes a base surface from which extends a side member having first and second opposed seat side surfaces, the first and second seat side surfaces separated by generally increasing distances from a narrower notch end to a wider notch end to form a notch, and the first and second seat side surfaces spaced apart to form an opening at the narrower notch end;

a propulsion system capable of moving the electronic component radially from the electronic component-sized cavity into the test seat such that one of the electronic component end surfaces contacts the base surface and one of each of the first and second electronic component side surfaces rests against different ones of the first and second seat side surfaces so that one of the side margins covered by one of the first and second wraparound electrodes projects outwardly through the opening and one of the side margins covered by the other one of the first and second wraparound electrodes not in proximity to the first and second seat side surfaces projects outwardly of the wider notch end; and a test device positioned to perform a parametric test on the side margin of the electronic component that projects outwardly of the opening in the narrower notch end of the test seat.

9. The electronic component handler of claim 8, further including a second test device, wherein the test device and the second test device perform parametric tests on each of the side margins of the electronic component that project outwardly of the narrower and wider notch ends of the test seat to effect double-sided parametric testing of the electronic component.

10. The electronic component handler of claim 8, in which the electronic component is one of a chip capacitor and an integrated passive electronic component.

11. The electronic component handler of claim 8, in which the first and second opposed seat side surfaces of the test seat are angularly disposed at an approximate right angle.

12. The electronic component handler of claim 8, in which the propulsion system operates using one of a suction or air blowing process.

13. The electronic component handler of claim 8, in which the bosses are uniformly angularly spaced along the outer rim of the feed wheel.

14. The electronic component handler of claim 8, in which the test seats are uniformly angularly spaced along the peripheral wall of the carrier wheel.

15. The electronic component handler of claim 8, further including an ejection assembly for ejecting the electronic component from the test seat.

16. The electronic component handler of claim 8, in which the parametric test is selected from a group consisting essentially of an electrical, image, inspection, and visual test.

17. In an electronic component handler capable of receiving and performing parametric testing on an electronic component that includes a body having a pair of first opposite side surfaces, a pair of second opposite side surfaces, and a pair of end surfaces, each of the pair of first opposite side surfaces having opposite side margins shared in common with side margins of different ones of the second opposite side surfaces, the pair of first opposite side surfaces being spaced apart by a first distance defined by first opposite side margins of the pair of end surfaces and the pair of second opposite side surfaces being spaced apart by a second distance defined by second opposite side margins of the pair of end surfaces; the electronic component further including a first wraparound electrode wrapping around the opposite side margins of one of the pair of the first opposite side surfaces to form first electrical contact regions on the second side surfaces, and a second wraparound electrode wrapping around the opposite side margins of the other one of the pair of first opposite side surfaces to form second electrical contact regions on the second side surfaces, an improvement comprising:

a test seat including a base surface from which extends a side member having first and second opposed seat side surfaces, the first and second seat side surfaces separated by generally increasing distances from a narrower notch end to a wider notch end to form a notch, and the first and second seat side surfaces spaced apart to form an opening at the narrower notch end; and the test seat sized and shaped to hold within it the electronic component such that one of the end surfaces of the electronic component contacts the base surface and one of each of the first and second electronic component side surfaces rests against different ones of the first and second seat side surfaces so that one of the side margins covered by one of the first and second wraparound electrodes projects outwardly through the opening and one of the side margins covered by the other one of the first and second wraparound electrodes not in proximity to the first and second seat side surfaces projects outwardly of the wider notch end.

18. The electronic component handler of claim 17, in which the electronic component is one of a chip capacitor and an integrated passive electronic component.

19. The electronic component handler of claim 17, in which the first and second opposed seat side surfaces of the test seat are angularly disposed at an approximate right angle.

* * * * *